US006593251B2

(12) United States Patent
Baklanov et al.

(10) Patent No.: US 6,593,251 B2
(45) Date of Patent: Jul. 15, 2003

(54) METHOD TO PRODUCE A POROUS OXYGEN-SILICON LAYER

(75) Inventors: Mikhail Baklanov, Leuven (BE); Denis Shamiryan, Heverlee (BE); Karen Maex, Herent (BE); Serge Vanhaelemeersch, Leuven (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 09/902,544

(22) Filed: Jul. 9, 2001

(65) Prior Publication Data

US 2002/0022378 A1 Feb. 21, 2002

Related U.S. Application Data

(60) Provisional application No. 60/217,119, filed on Jul. 10, 2000.

(51) Int. Cl.[7] ........................ H01L 21/31; H01L 21/469

(52) U.S. Cl. ........................ 438/778; 438/784; 438/787

(58) Field of Search ................................ 438/758, 762, 438/765, 769, 778, 787, 784

(56) References Cited

U.S. PATENT DOCUMENTS

| | | | | |
|---|---|---|---|---|
| 6,287,987 B1 * | 9/2001 | Miller et al. | ................ | 438/763 |
| 6,316,833 B1 * | 11/2001 | Oda | ........................... | 257/758 |

FOREIGN PATENT DOCUMENTS

| | | |
|---|---|---|
| EP | 0 684 642 A1 | 11/1995 |
| WO | WO 99/19910 | 4/1999 |
| WO | WO 00/12999 | 3/2000 |

* cited by examiner

*Primary Examiner*—Olik Chaudhuri
*Assistant Examiner*—Hsien-Ming Lee
(74) *Attorney, Agent, or Firm*—Knobbe Martens Olson & Bear LLP

(57) ABSTRACT

The present invention concerns a method to produce a porous oxygen-silicon insulating layer comprising following steps:
applying a silicon oxygen layer to a substrate
exposing the said substrate to a HF ambient.

16 Claims, 7 Drawing Sheets

METHOD TO PRODUCE A POROUS OXYGEN-SILICON LAYER

This application claims the benefit of U.S. Provisional Application No. 60/217,119, filed Jul. 10, 2000.

FIELD OF THE INVENTION

The present invention is situated in the field of microelectronics and more precisely related to a method of forming a porous dielectric layer having a low dielectric constant for reducing capacity coupling on a semiconductor device.

STATE OF THE ART

Integrated circuits combine many transistors on a semiconductor, e.g. a single crystal silicon, chip to perform complex functions.

The continuing scaling down of transistor size makes very important the delay caused by resistance capacitance coupling of the interconnecting wiring. This effect limits achievable speed and degrades the noise margin used to insure proper device operation.

In order to decrease this parasitic capacitance, materials with a low dielectric constant (low k-materials) are continuously developed.

The most common semiconductor dielectric is silicon dioxide which has a dielectric constant of about 4. Air has a dielectric constant of 1.0, which makes it obvious to increase the amount of air incorporated in the dielectric layer without giving in on the mechanical strength of this dielectric layer.

Gnade discloses in EPA1/0684642 a process for creating a porous dielectric layer by using vacuum or ambient pressures to regulate the porosity.

Ahn discloses in WO 99/19910 an integrated circuit including one porous SiOC insulator, providing a dielectric constant lower than 2 for minimising parasitic capacitance. This document teaches a method using a coating and a pyrolysis of oxide and carbon sources.

The methods described in the state of the art are either complex or performed at very high temperatures (between 450 and 1200 degrees Celsius) and alters heavily the geometry of the silicon wafers and the integrated circuits formed on and in these silicon wafers or other substrates, liquefying most of the metals used in e.g. copper damascene back-end processing or e.g Aluminum-based metallisation schemes.

The problem to solve is the modification of the dielectric constant under soft physical and chemical conditions to preserve the geometry and the chemical composition of the porous insulating layer.

AIMS OF THE INVENTION

The aim of the present invention is to increase the porosity of the CVD Silicon-oxygen film under soft physical and chemical conditions to avoid any change of the chemical composition and of the material properties. These physical and chemical conditions are compatible with the substrates and the layers formed thereon.

An additional purpose of this invention is to prepare ultra low-k dielectric films with higher chemical stability compared to Nanoglass and porous SSQ based materials.

An aim of the invention is to substantially change the porosity of a dielectric film without substantially changing the thickness of this dielectric film.

SUMMARY OF THE INVENTION

The present invention provides a method to produce a porous dielectric such as a silicon-oxygen layer.

For the purpose of this invention, silicon-oxygen should be understood as an insulating layer comprising at least Si and O, e.g. $SiO_2$, or at least Si, C and O, e.g. silicon oxycarbide (SiOC), or at least Si, N, O and C, e.g. nitrited silicon oxycarbide, or at least Si, C, O and H, e.g. hydrogenated SiOC, or at least Si, O, C, N and H, e.g. hydrogenated SiNOC, but is not limited hereto.

A first aspect of this invention discloses a method for forming a porous silicon-oxygen layer comprising the steps of applying the said layer on a substrate and exposing it to a HF ambient. Ambient should be understood as a gaseous mixture, a solution, a mist or a vapor.

A key feature of the present invention is that the concentration of the HF in the ambient is determined such that the etching increases the pore size from 1 to 3 nm, without altering the thickness of the silicon-oxygen layer.

In a preferred embodiment of the invention, a hydrogenated silicon oxycarbide layer is deposited by CVD.

A further aspect of the present invention is the determination of the optimum process conditions. That means the determination of the HF concentration to reach the ideal etching rate of the pores compared to the film.

The ideal HF concentration has been determined and is lower than 5% aqueous HF solution. Preferably the concentration of HF in the aqueous solution is lower than 2%. The HF concentration is depending on the pore size and of the nature of the silicon-oxygen layer.

The final aspect of the present invention is characterised in that the HF etching conditions are very soft and can occur at room temperature and at atmospheric pressure. The process conditions are compatible and integratible with existing semiconductor production process and materials. The process conditions doesn't result in an substantial change in material characteristics and without marring the integrity of the semiconductor substrate or materials formed upon this semiconductor substrate.

SHORT DESCRIPTION OF THE DRAWINGS

Figure 7:
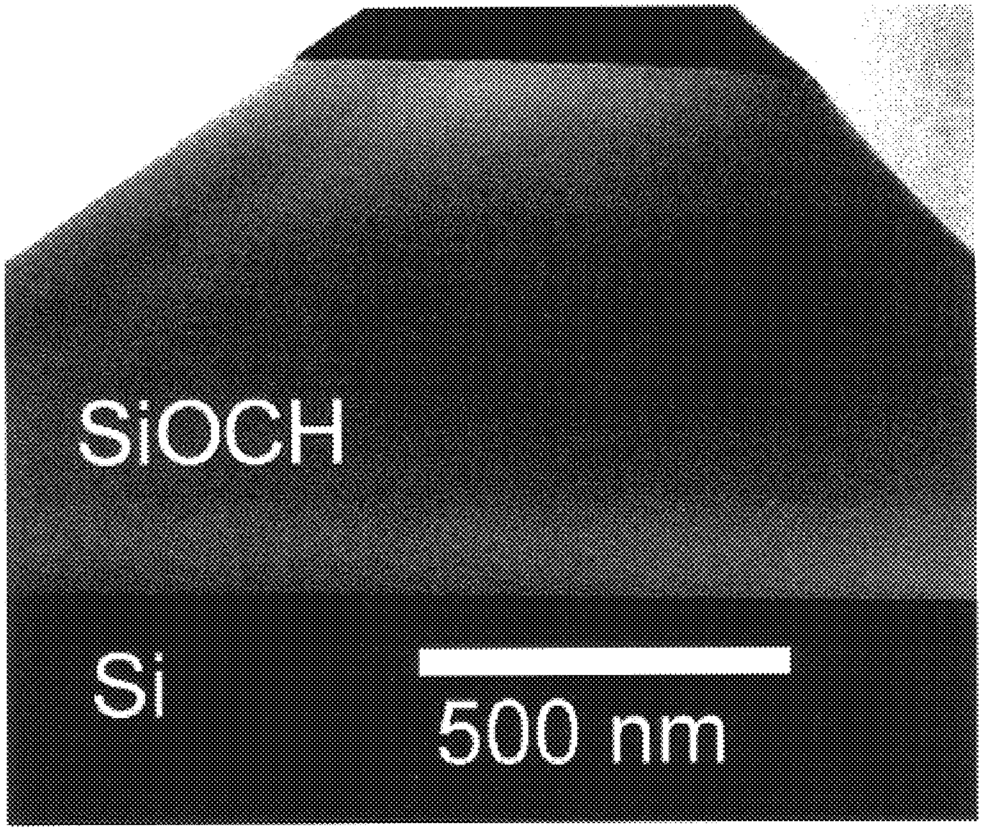
Figure 8:
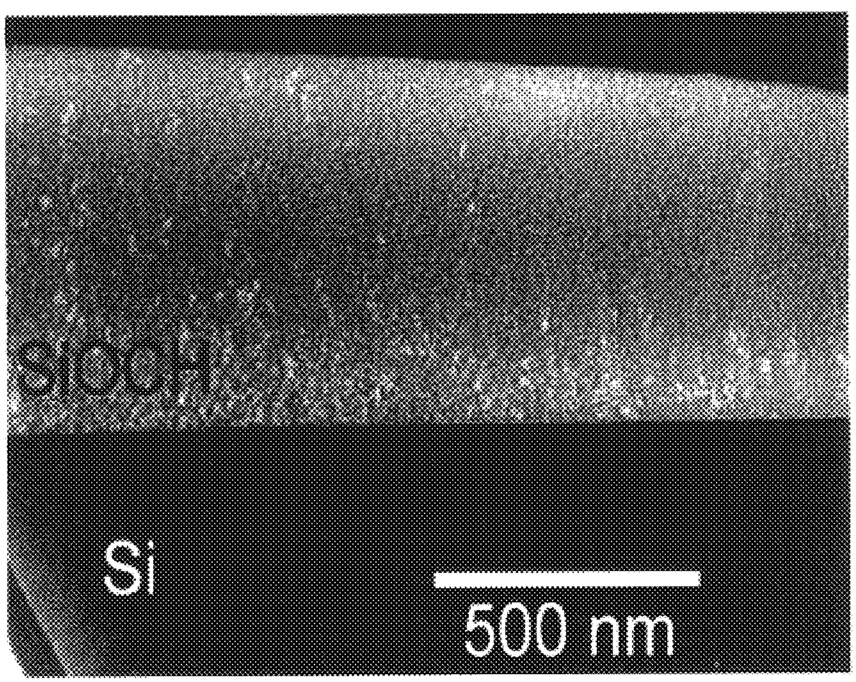

FIG. 7 and FIG. 8 TEM micrographs of the SiOCH before and after 5 minutes 2%HF treatment

DETAILED DESCRIPTION OF THE INVENTION

The Chemical Vapour Deposition (CVD) silicon oxycarbide films are becoming very popular low-k materials for the advanced interconnects because of their compatibility with the traditional ULSI (Ultra large scale integration comprising more than 1 million transistors/chip) technology and their high chemical stability.

In this material, a part of the oxygen atoms in the $SiO_{4/2}$ structure is replaced by —$CH_x$— groups. Since the Si—C bond has a lower polarizability than the Si—O bond, SiOCH has a lower dielectric constant, than $SiO_2$.

Moreover, a SiOCH film has a microporous structure, that is probably related to a partial termination of the Si—O—Si network by a —$CH_3$ radical.

The film porosity results in a further decrease of the film permittivity. A deposited SiOCH film has a typical dielectric constant (k value) in the 2.6–2.8 range, which is less than the k value of $SiO_2$ and is comparable with organic low-k films like SiLK. (Silk is a registered trademark from the Dow Chemical Company)

The SiOCH films are more chemically stable than most of porous inorganic low-k films like Nanoglass. (Nanoglass is a registered trademark from the Allied Signal Company.) and porous hydrogen or methyl-silsesquioxanes (SSQ) based porous films. Therefore, the issues related to the dry etching and post-dry-etch cleaning could find more simple solutions.

Several basic ideas were used to develop the key features of the present invention.

It was established that a diluted HF solution is able to etch the top surface and the pore walls or inner surfaces in porous $SiO_2$ with substantial the same rate.

This process leads to a significant change of the film porosity and pore size. The most important physical requirement for such type of modification is that the diffusion rate of active species and reaction products in pores must be much higher than the etch rate of the $SiO_2$ by HF. Because of this higher diffusion rate compared to the etch rate substantial the same concentration is present on all the surfaces, top and inner surfaces, of the dielectric film.

A chemical vapor deposited SiOCH film is microporous and more resistant to HF. However, SiOCH contains siloxane-like Si—O—Si groups that are attacked by HF. Therefore, the process described above can be realized. The dielectric layer has a chemical structure in which a group is present that can easily be attacked by the applied chemicals. The uniform etching/modification of the SiOCH surface and the pore walls decreases the SiOCH thickness. However, the thickness loss of a few nm is negligible, less than 1% of the stack thickness, while the process has a huge impact on the pore radius, multiplied by 3) and the dielectric constant of the film.

This invention discloses a diluted HF solution able to increase the film porosity and the pore radius of the chemical vapor deposed SiOCH film without significant loss of the film or stack thickness.

The key feature of the present invention is a novel method for controllable increase the porosity of low-k silicon oxycarbide films (SiOCH hereafter), deposited by oxidation of 3-methylsilane.

A particular embodiment of this invention is the etching of the SiOCH film by a diluted HF solution. The modified SiOCH film is characterized by FTIR, XPS and EP.

It is particularly surprising that the chemical composition of the modified SiOCH film remains almost the same during the etching and that no significant thickness loss is observed, while the pore radius and the film porosity increase significantly with HF dip time.

The results clearly indicate that isotropic etching inside of pores as well as at the film surface causes the increase of the pore radius.

The very low etch rate of SiOCH film by diluted HF and large difference between the pore radius and the film thickness allows an increase in the porosity without significant thickness loss.

DESCRIPTION OF A PREFERRED EMBODIMENT OF THE INVENTION

The present invention discloses a way to prepare ultra low-k dielectric films with higher chemical stability compared to oxide and silsesquioxane-based porous materials.

The SiOCH low-k films were deposited by a plasma enhanced oxidation of $(CH_3)SiH$ by $N_2O$ at 400° C. in the Applied Material P5000 chemical vapor deposition tool. The as-deposited SiOCH film had a dielectric constant close to 2.7 and a refractive index of 1.41–1.43.

These films were etched in a diluted HF (2%) solution for various times (up to 10 minutes). Samples were etched at room temperature in a relatively large volume of solution (500 ml per 1 $cm^2$ sample) and dried by compressed nitrogen.

After the etching, the refractive index and the thickness of the films were measured by ellipsometry (Sentech automatic single wavelength SE-401 ellipsometer).

The chemical composition of the SiOCH films was analyzed by FTIR and X-ray photoelectron spectroscopy (XPS). The FTIR spectra were recorded on a Bio-Rad FTIR spectrometer in order to investigate the chemical composition of the HF-modified films. The XPS analysis were done on a Fison SSX-100 spectrometer equipped with a monochromatic A1 Kα source and concentric hemispherical electron energy analyzer. The depth profiles of the chemical elements were obtained using the built-in ion sputter gun.

The porous structure of the films was studied by the ellipsometric porosimetry (EP). This method allows the film porosity and pore size distribution (PSD) to be determined by analyzing the change of the refractive index that occurs during the adsorption/desorption cycle of vapors of some organic adsorbates. Toluene vapor was used as an adsorbate. An apparatus and method for determining porosity is disclosed in the European application EP 1032816 and hereby incorporated by reference.

Figure 1:
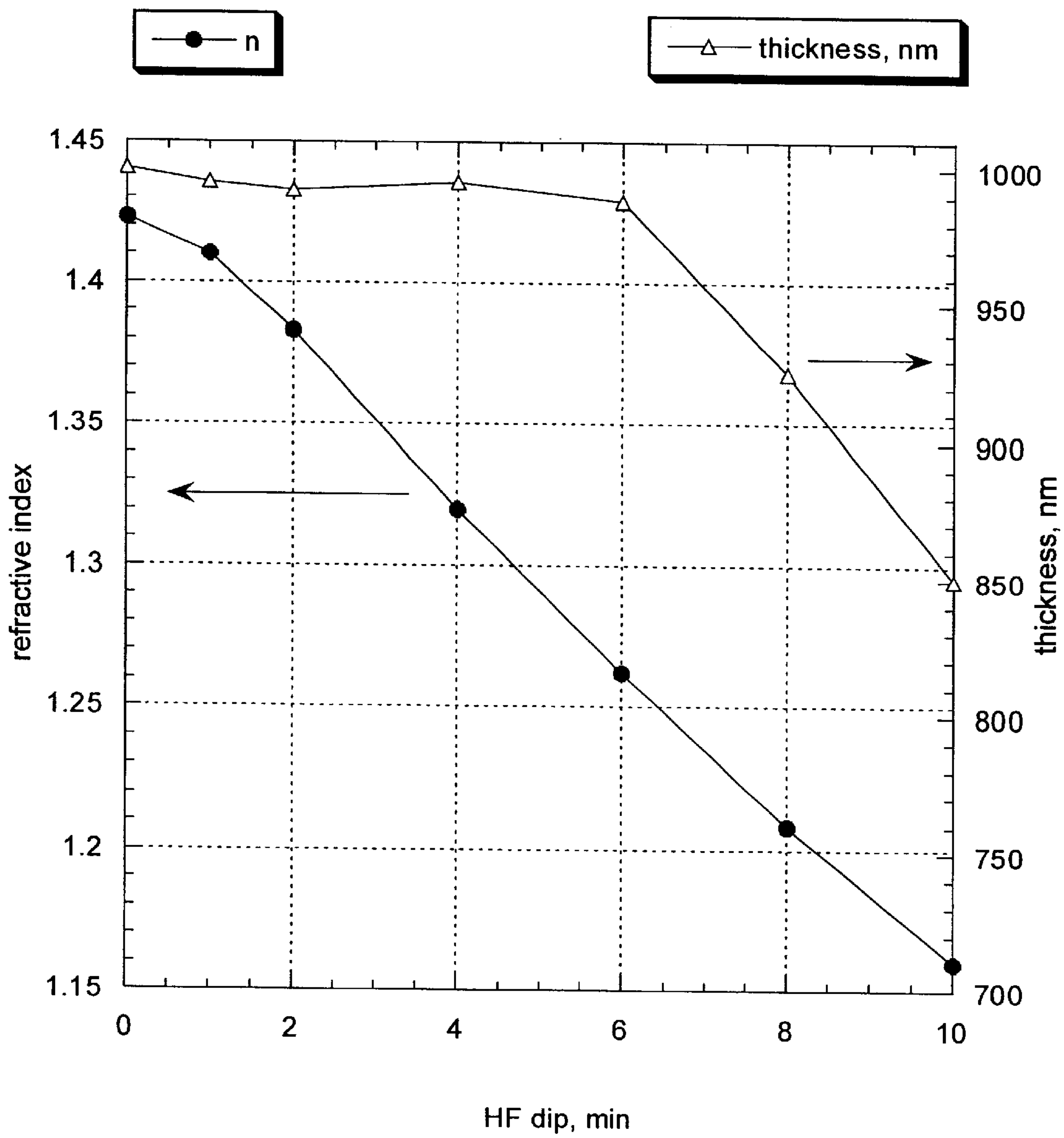
FIG. 1 represents the dependencies of the film thickness d and reactive index n of the HF dip time $t_{HF}$. The porosity increases, no change of the film thickness at t<6 min.

Initial refractive index (n) and thickness (d) of the SiOCH film were equal to 1.42 and 1000 nm, respectively (FIG. 1). This film has a chemical composition typical for the CVD SiOCH films: IR absorption peaks corresponding to Si—O, C—H, Si—$CH_3$, Si—H and Si—C bonds were observed. (FIG. 5)

The change of the n and d values during the HF treatment is shown in FIG. 1. After a short incubation period of about 1–2 minutes the refractive index linearly decreases with HF dip time, while the thickness remains almost constant up to 6 minutes of the HF treatment.

Change of the composition of the SiOCH film is not significant even after 8 min etching in a HF solution when thickness of the film begins to decrease.

Figure 5:
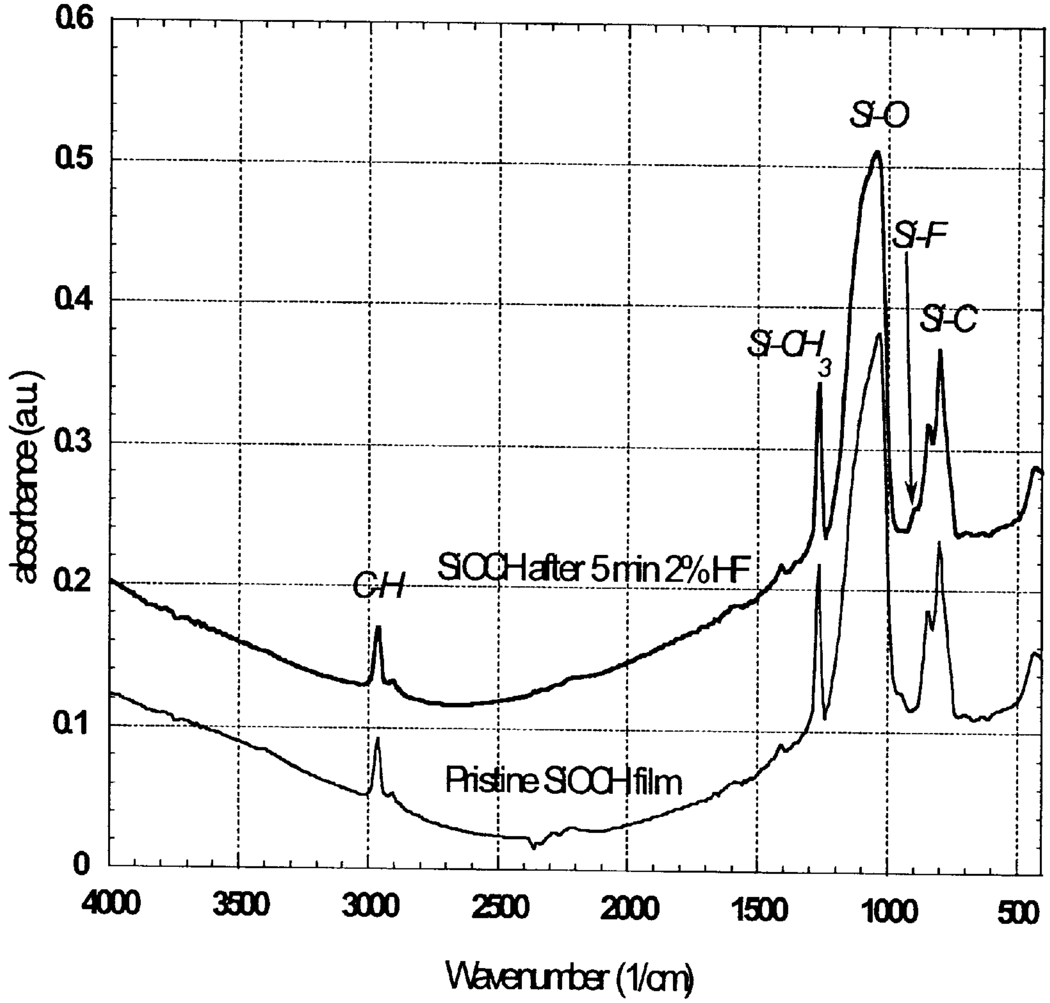
FIG. 5 shows a infrared spectra of the SiOCH film before and after a HF treatment.
Figure 6:
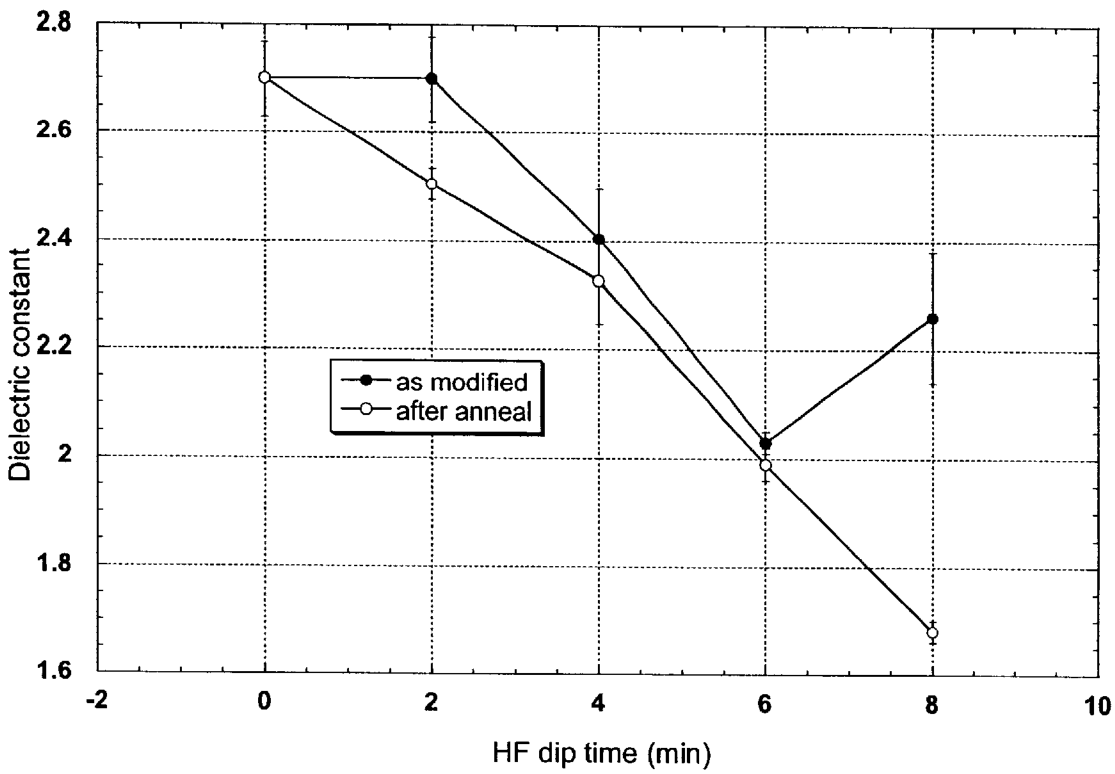
FIG. 6 shows the dielectric constant of the modified SiOCH film as a function of modification time. Filled circles represent k-value of as modified film; open circles represent k-value after anneal of modified film for 5 minutes at 310° C.

The FTIR spectra before and after HF etching are shown in FIG. 5. After HF treatment a small peak appeared at about 900 $cm^{-1}$, it can be identified as a Si—F bond. Moreover, the largest peak identified as a Si—O bond for pristine SiOCH film is slightly shifted towards the higher wave number. This shift can be explained by appearance of a small peak at about 1200 $cm^{-1}$, which corresponds, to a C—F bond.

It should be noted that no water peak at 3500 $cm^{-1}$ appeared after the HF treatment. It means that the SiOCH surface remains hydrophobic. This statement is also supported by thermodesorption (TDS) data.

Some increase of adsorbed water has been found by TDS, however, this increased value is less than that one after etching the film in $O_2/CF_4/CHF_3$ plasma needed to create openings in the dielectric layers to contact the underlying metal wiring. Further, no increase of a k value of the plasma etched film was found, therefore, the modified SiOCH film is expected to have no k value increase due to water adsorption. The decrease in the intensities of the peaks is explained by a decreasing in the IR absorption due to the increase of the film porosity (absolute value of porosity is equal to 57% for this film).

The concentration profiles of Si, C, O, and F were analyzed by XPS after the layer-by-layer etching by the built-in ion gun. The atomic concentration of these elements normalized to Si content in the blanket or as-deposited SiOCH film were equal to Si:O:C=1.00:0.70:0.53.

The surface concentration of silicon is less than in the film volume, the oxygen concentration is higher (Si:O:C=1.00:1.09:0.72 for the surface). The surface concentration of carbon is almost equal to the volume concentration.

The enrichment of the film surface by oxygen and decrease of the silicon concentration are probably related to partial oxidation of the SiOCH film by atmospheric oxygen.

Etching of this film in a HF solution slightly changes both surface and volume concentration of the elements. The elements concentration equal to Si:O:C=1.00:0.79:0.74 was found in the film volume and Si:O:C=1.00;1.09;1.00 on the film surface. Therefore, only some increase of the carbon concentration and decrease of the Si concentration is caused by the HF etching.

Additionally, some fluorine (Si:F=1:0.08) was detected both on the film surface and inside the film after the HF etching.

An insignificant change of the film composition (increase of carbon concentration and appearance of small Si—F and C—F peaks in the FTIR spectra) is due to the partial removal of siloxane groups from the film surface (both top surface and pore sidewalls) and formation of chemisorbed and non-soluble $CF_x$ and $SiF_x$ groups.

These insignificant changes of the film composition cannot provide the observed decrease of the refractive index. Based on the Lorentz-Lorentz equation, it may be assumed that the HF etching changes the film density. Therefore, an examination of the film porosity is an important issue.

The film porosity and PSD were measured after the different HF etching times. The film porosity was measured by determination of the toluene volume condensed in porous film (open porosity).

Figure 3:
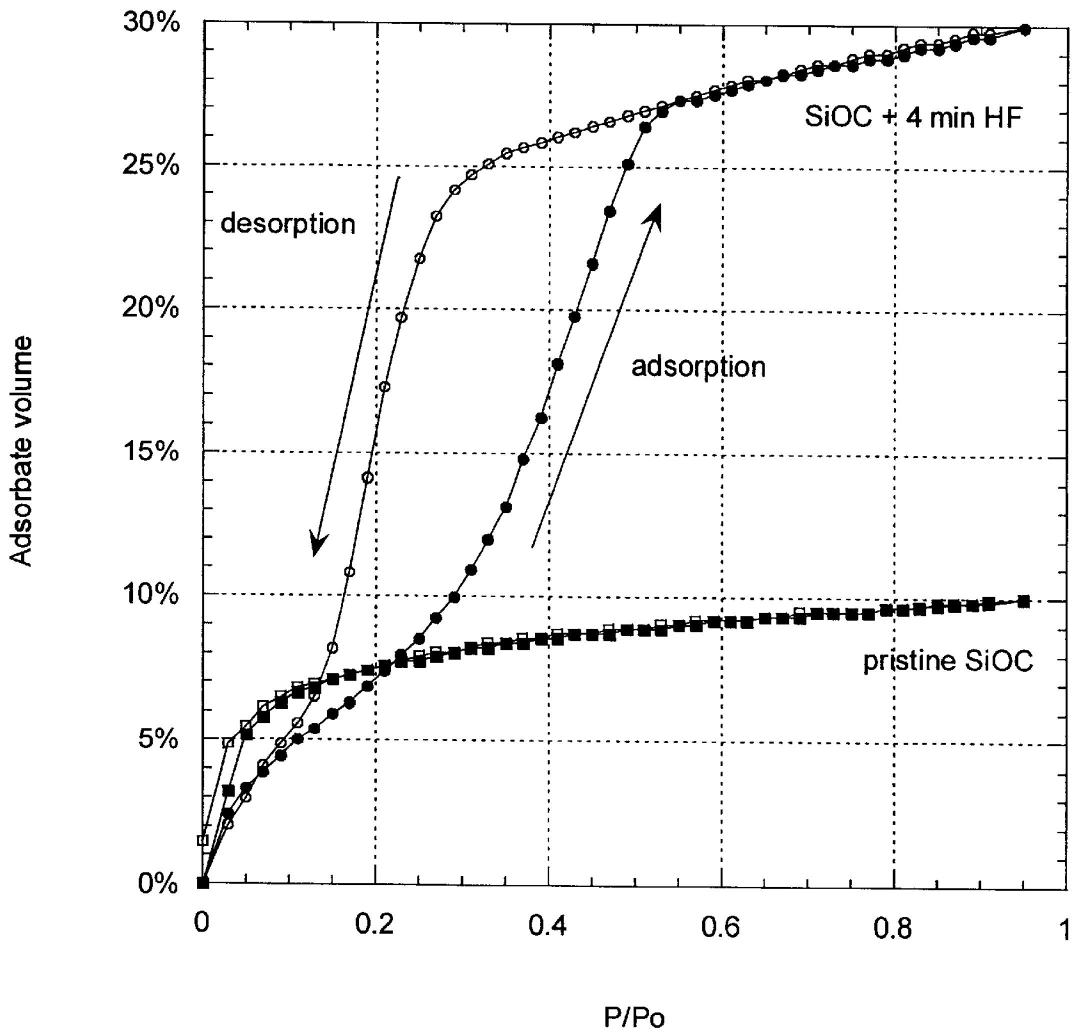
FIG. 3 represents the adsorbate volume as a function of relative pressure. The film porosity has increased 3 times during the 4 minutes etching.
Figure 4:
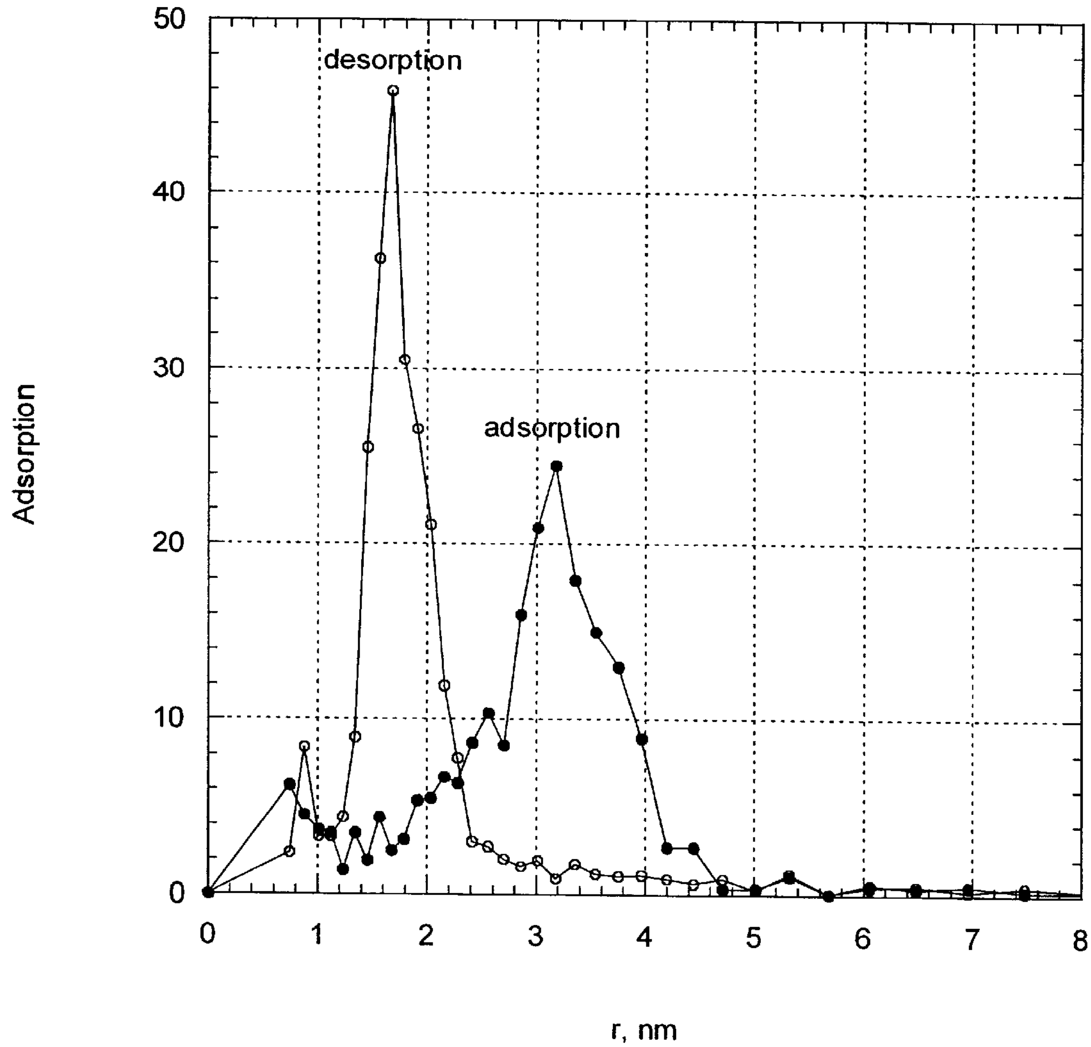
FIG. 4 shows the pore radius distribution and desorption of toluene on the porous SiCOH film (4 min HF dip). The pore radius has increased from 0.4 nm to 1.7 nm.

The results of these measurements fit very well to a single-film model even for 2 min HF treatment. It means that HF penetrates throughout the whole film at the early stage of etching. The typical results for 4-min HF etching are shown in FIGS. 3 and 4. FIG. 3 shows the change of the adsorbative volume as a function of the toluene relative pressure.

The adsorption/desorption isotherm is typical for a microporous film. The toluene adsorption (solid squares) and desorption (open squares0 occur at the relative toluene pressure $P/P_0$ (where $P_0$ is saturated toluene pressure) below 0.1 and almost no hysteresis loop is observed.

This behaviour suggests that the pore radius in the SiOCH is less than 1 nm. The relative volume of the open pores is close to 10% of the film volume.

The adsorption/desorption isotherms dramatically change after the HF etching. The relative volume of the open pores has increased up to 30% and the hysteresis loop between the adsorption and desorption curves becomes typical for a mesoporous film. However, the low-pressure branch related to the micropores is still observed (FIG. 4, left side at lower r ranges).

The mean pore radius calculated from the desorption curve has increased up to 1.6 nm. The pore radius that was calculated from the adsorption curve is 2 times higher. According to the porosimetry theory, this difference suggests that the pores can be described well by a model of cylindrical pores (differences in effective radius of curvature of cylindrical and spherical meniscus formed during the vapor adsorption and desorption, respectively).

Figure 2:
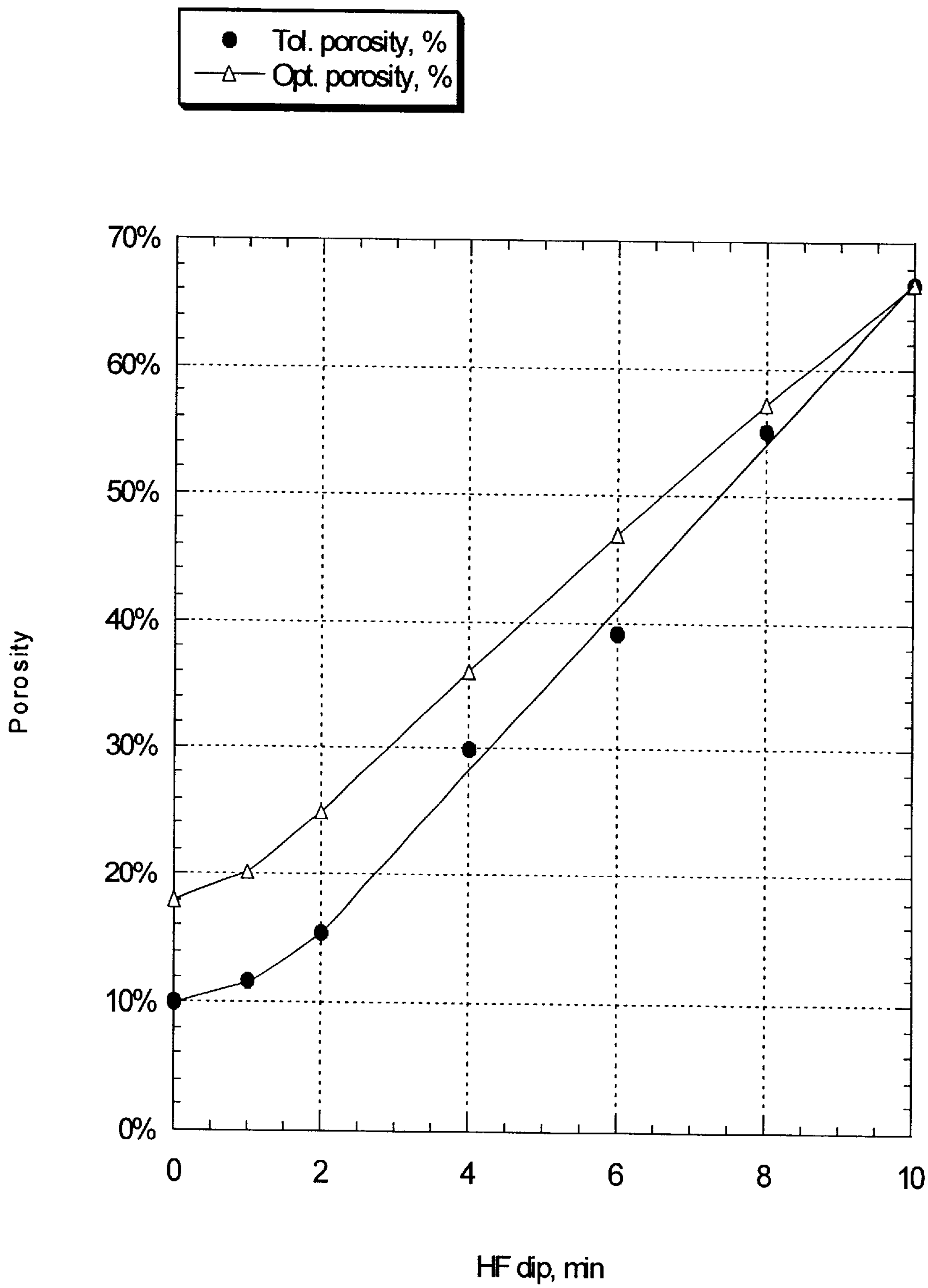
FIG. 2 represents the dependence of the full (optical) porosity (triangles) and porosity measured as an amount of absorbed toluene (open porosity) (circles) on the HF dip time.

FIG. 2 shows the dependence of the film porosity on the HF dip time. The two types of porosity are plotted on the same graph. The first one mentioned above, as the "open porosity" is the relative volume of the toluene adsorbed by the film.

The "open porosity" ("Tol. Porosity" in FIG. 2, indicated by solid circles) is related to pores available for the toluene penetration, therefore this value gives information related to the open pore concentration. Some pores may be not available for the toluene adsorption (closed pores). Therefore, the real (full) film porosity ("Opt. Porosity in FIG. 2 indicated by open triangles) that defines the value of a dielectric constant can be higher than the open porosity. The "full" film porosity was calculated with an assumption that there are no closed pores at the maximal measured toluene porosity=66.7%.

There are two reasons supporting this assumption:

Analysis of different types of mezoporous low-k films shows that normally all pores are open (interconnected) if the film porosity is higher than 50% (the pore volume is higher than the percolation threshold);

The adsorption/desorption isotherm of the modified SiOCH film does not have low-pressure branch related to micropores.

If all pores are open, the Ellipsometric Porosimetry allows the calculation of the refractive index of the film skeleton. The refractive index of the film skeleton calculated for the film with the highest porosity (66.7%) was equal to n=1.533. This is an intermediate value between $SiO_2$ (1.46) and CVD SiC (=2.00).

This value allows the calculation of the full porosity of the film. The full porosity of the pristine SiOCH film was equal to 18% while the porosity calculated from the amount of adsorbed toluene is equal to 10%. Therefore, 45% of pores in the pristine film were "closed" (not interconnected). The degree of pore interconnection monotonically increases with HF etch time.

According to the invention, the porosity and the mean pore size in a SiOCH film can be changed by etching in a HF solution by a controllable way without significant change of the film composition, thickness and the chemical properties. Such modified films can be used as an ultra low-k dielectric with chemical properties similar to a deposited SiOCH film.

What is claimed is:

1. A method to produce a porous oxygen-silicon insulating layer comprising the following steps:

applying an oxygen-silicon insulating layer to a substrate; and exposing the oxygen-silicon insulating layer to a HF ambient, whereby at least one of a porosity of the oxygen-silicon insulating layer and a mean pore size of the oxygen-silicon insulating layer is increased, characterized in that the oxygen-silicon insulating layer comprises at least Si, C and O.

2. A method as in claim 1, characterized in that the oxygen-silicon insulating layer further comprises N.

3. A method as in claim 1, characterized in that the oxygen-silicon insulating layer further comprises H.

4. A method as in claim 1, characterized in that the oxygen-silicon insulating layer further comprises N and H.

5. A method as in claim 1, characterized in that the oxygen-silicon insulating layer comprises a hydrogenated silicon oxycarbide layer.

6. A method as in claim 1, wherein the step of applying an oxygen-silicon insulating layer comprises depositing a hydrogenated silicon oxycarbide layer by chemical vapor deposition.

7. A method as in claim 5, characterized in that the hydrogenated silicon oxycarbide layer has a dielectric constant lower than 2.3.

8. A method as in claim 5, characterized in that the hydrogenated silicon oxycarbide layer has a dielectric constant below 2.0.

9. A method as in claim 5, characterized in that a HF concentration of the HF ambient is regulated to increase the mean pore size of the oxygen-silicon insulating layer from 1 to 3 nm, while a thickness of the oxygen-silicon insulating layer remains unchanged.

10. A method as in claim 9, characterized in that the HF concentration is lower than 5% dissolved in water.

11. A method as in claim 10, characterized in that the HF concentration is lower than 2% dissolved in water.

12. A method as in claim 9, characterized in that the step of exposing the oxygen-silicon insulating layer to a HF ambient occurs at room temperature.

13. A method as in claim 9, characterized in that the step of exposing the oxygen-silicon insulating layer to a HF ambient occurs at atmospheric pressure.

14. A method as in claim 9, characterized in that a duration of the step of exposing the oxygen-silicon insulating layer to a HF ambient is less than 10 minutes.

15. A method as in claim 9, characterized in that a duration of the step of exposing the oxygen-silicon insulating layer to a HF ambient is less than 6 minutes.

16. A method as in any of the claims 5, 6 or 9, characterized in that the HF ambient comprises a HF solution, and wherein a concentration of the HF solution and a duration of the step of exposing the oxygen-silicon insulating layer to a HF ambient are related to a nature of the oxygen-silicon insulating layer.

* * * * *